(12) United States Patent
Nozoe et al.

(10) Patent No.: US 8,159,116 B2
(45) Date of Patent: Apr. 17, 2012

(54) PIEZOELECTRIC DEVICE, ELECTRONIC DEVICE USING THE SAME, AND AUTOMOBILE

(75) Inventors: Toshiyuki Nozoe, Kyoto (JP); Hideo Ohkoshi, Osaka (JP)

(73) Assignee: Panasonic Corporation, Osaka (JP)

( * ) Notice: Subject to any disclaimer, the term of this patent is extended or adjusted under 35 U.S.C. 154(b) by 179 days.

(21) Appl. No.: 12/680,801

(22) PCT Filed: Nov. 7, 2008

(86) PCT No.: PCT/JP2008/003232
§ 371 (c)(1),
(2), (4) Date: Mar. 30, 2010

(87) PCT Pub. No.: WO2009/069253
PCT Pub. Date: Jun. 4, 2009

(65) Prior Publication Data
US 2010/0219723 A1    Sep. 2, 2010

(30) Foreign Application Priority Data
Nov. 27, 2007    (JP) .................................. 2007-305413

(51) Int. Cl.
*H01L 41/053*    (2006.01)
(52) U.S. Cl. ........................................ 310/348; 310/370
(58) Field of Classification Search .................. 310/320, 310/321, 340, 344, 348, 370
See application file for complete search history.

(56) References Cited

U.S. PATENT DOCUMENTS

| 7,145,416 | B2 * | 12/2006 | Mizuno | .......................... 333/186 |
| 2002/0096974 | A1 * | 7/2002 | Moon et al. | .................... 310/345 |
| 2005/0040734 | A1 * | 2/2005 | Kinoshita | ..................... 310/348 |
| 2007/0138914 | A1 |  | 6/2007 | Ishikawa et al. |

FOREIGN PATENT DOCUMENTS

| CN | 1983658 A | 6/2007 |
| JP | 2000-304763 A | 11/2000 |
| JP | 2007-165664 A | 6/2007 |
| JP | 2007-167854 A | 7/2007 |
| JP | 2007-1678544 A | 7/2007 |

OTHER PUBLICATIONS

International Search Report for PCT/JP2008/003232.
Chinese Office Action dated May 11, 2011.

* cited by examiner

*Primary Examiner* — Derek Rosenau
(74) *Attorney, Agent, or Firm* — Pearne & Gordon LLP

(57) ABSTRACT

A piezoelectric device according to the present invention includes lead wires (12) each having one end electrically connected to a circuit pattern, and a piezoelectric oscillator (13) having terminals (13a) electrically connected to the other ends of the lead wires (12), wherein the piezoelectric oscillator (13) is retained in suspension by the other ends of the lead wires (12), and a support member (14) is provided on surfaces (12b) opposite to connecting surfaces (12a) of the lead wires (12) connected to the piezoelectric oscillator (13) at the other ends thereof.

16 Claims, 5 Drawing Sheets

PIEZOELECTRIC DEVICE, ELECTRONIC DEVICE USING THE SAME, AND AUTOMOBILE

TECHNICAL FIELD

The present invention relates to a piezoelectric device used as, for example, a sensing feature of an electronic device such as a digital camera and an automobile.

BACKGROUND ART

As shown in FIG. 10, a conventional piezoelectric device of this type thus available includes lead wires 2 each having one end electrically connected to a circuit pattern, and piezoelectric oscillator 3 having terminals 3a electrically connected to the other ends of lead wires 2, wherein piezoelectric oscillator 3 is retained in suspension by the other ends of lead wires 2. In the piezoelectric device, lead wires 2 are responsible for transmitting an electrical signal to piezoelectric oscillator 3 and supporting piezoelectric oscillator 3.

An example of the conventional art documents relating to the present application is Patent Document 1.

A problem to be desirably solved in the conventional piezoelectric device is its poor reliability in electric characteristics.

The conventional structure, wherein lead wires 2 are responsible for transmitting an electrical signal to piezoelectric oscillator 3 and supporting piezoelectric oscillator 3, possibly undergoes electrical connection failure at terminals 3a having surfaces for connecting lead wires 2 to piezoelectric oscillator 3 and vicinity of the terminals 3a in the case where a stress is locally applied thereto, resulting in poor reliability in electrical characteristics.

Patent Document 1: Unexamined Japanese Patent Publication No. 2007-167854

DISCLOSURE OF THE INVENTION

A main object of the present invention is to improve reliability in electrical characteristics of a piezoelectric device wherein lead wires support a piezoelectric oscillator.

A piezoelectric device according to the present invention includes lead wires each having one end electrically connected to a circuit pattern, and a piezoelectric oscillator having terminals electrically connected to the other ends of the lead wires, wherein the piezoelectric oscillator is retained in suspension by the other ends of the lead wires, and a support member is provided on surfaces opposite to connecting surfaces of the lead wires connected to the piezoelectric oscillator at the other ends thereof.

In the piezoelectric device according to the present invention, the support member, which is provided on the surfaces opposite to the surfaces connected to the piezoelectric oscillator at the other ends of the lead wires, serves to disperse a stress applied to between the lead wires and the piezoelectric oscillator in the support member, thereby lessening the likelihood that the stress is locally applied to the surfaces where the lead wires are connected to the piezoelectric oscillator. As a result, the piezoelectric device according to the present invention can improve its reliability in electrical characteristics.

Figure 1:
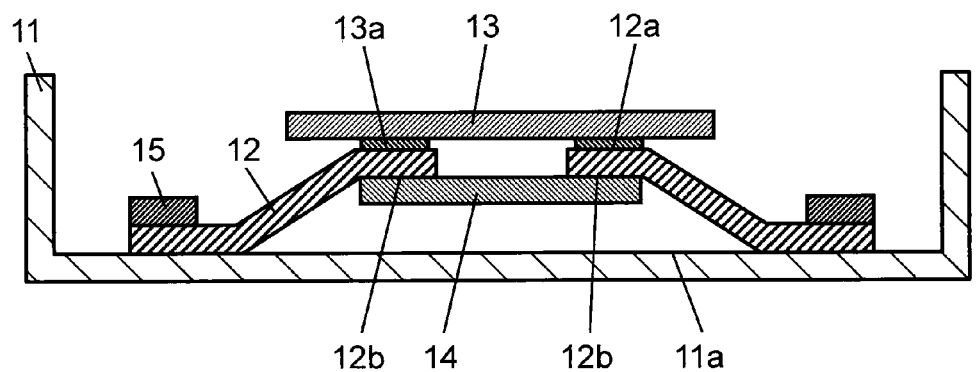
FIG. 1 is a sectional view of a piezoelectric device according to a preferred embodiment 1 of the present invention.

REFERENCE MARKS IN THE DRAWINGS 12 lead wire
12a connecting surface
12b opposite surface
13 piezoelectric oscillator
13a terminal
14 support member Preferred Embodiments For Carrying Out The Invention Hereinafter, embodiments of the present invention are described referring to the drawings. To help the drawings be clearly understood, a dimension in a thickness direction is enlarged. The same structural elements are shown with the same reference marks, and description of such structural elements, if redundant, may not be repeated.

Embodiment 1

Below is described a piezoelectric device according to embodiment 1 of the present invention referring to the drawings.

FIG. 1 is a sectional view of the piezoelectric device according to embodiment 1.

As shown in FIG. 1, the piezoelectric device according to embodiment 1 includes lead wires 12 each having one end electrically connected to a circuit pattern (not shown) provided on bottom surface 11a of outer housing 11, and piezoelectric oscillator 13 having terminals 13a electrically connected to the other ends of lead wires 12. In the piezoelectric device according to embodiment 1, piezoelectric oscillator 13 is retained in suspension by the other ends of lead wires 12.

More specifically, the one ends of lead wires 12 are disposed on bottom surface 11a of outer housing 11 such as a ceramic package, and upper surfaces of the one ends of lead wires 12 are supported by support substrate 15. On bottom surface 11a are formed an IC (not shown) for driving the piezoelectric device according to embodiment 1 and detecting a signal from the piezoelectric device, and the circuit pattern (not shown) electrically connected to the IC. The one ends of lead wires 12 are electrically connected to the circuit pattern, and the other ends of lead wires 12 are electrically connected to terminals 13a of piezoelectric oscillator 13. In the formation of the circuit pattern, a TAB (Tape Automated Bonding) substrate is preferably used so that the piezoelectric device can be further reduced in its vertical height.

At the other ends of lead wires 12, support member 14 is provided on surfaces 12b opposite to connecting surfaces 12a connected to piezoelectric oscillator 13. Support member 14 can be made of heat resistant resin such as polyimide or epoxy. More specifically, any of these resins is solidified in a plate shape and bonded to lead wires 12 and piezoelectric oscillator 13 by, for example, an adhesive.

According to the structure, support member 14 provided on surfaces 12b opposite to connecting surfaces 12a connected to piezoelectric oscillator 13 at the other ends of lead wires 12 serves to disperse a stress applied to between lead wires 12 and piezoelectric oscillator 13 in support member 14, thereby lessening the likelihood that the stress is locally applied to where lead wires 12 are connected to piezoelectric oscillator 13. As a result, the piezoelectric device according to the present invention can improve its reliability in mechanical and electrical characteristics.

In the present embodiment, connecting surfaces 12a connected to piezoelectric oscillator 13 at the other ends of lead wires 12 are opposite to the surfaces of lead wires 12 facing bottom surface 11a of outer housing 11, more specifically, the surface of outer housing 11 on which the one ends of lead wires 12 are disposed. However, the connecting surfaces connected to piezoelectric oscillator 13 may be the surfaces of lead wires 12 at the other ends thereof facing the surface of outer housing 11 where the one ends of lead wires 12 are disposed, in which case support member 14 is formed on the surfaces on the opposite side of the connecting surfaces. In other words, the alternative structure is obtained by reversing a positional relationship in vertical directions shown in FIG. 1 between piezoelectric oscillator 13 and support member 14 with the other ends of lead wires 12 interposed therebetween.

In this description, however, connecting surfaces 12a connected to piezoelectric oscillator 13 at the other ends of lead wires 12 are preferably opposite to the surfaces of lead wires 12 facing the surface of outer housing 11 on which the one ends of lead wires 12 are disposed as shown in FIG. 1. Such a positional relationship can preferably avoid the disadvantage that the shape of piezoelectric oscillator 13 is subject to restrictions associated with lead wires 12, thereby increasing a degree of freedom in designing the device.

Figure 2:
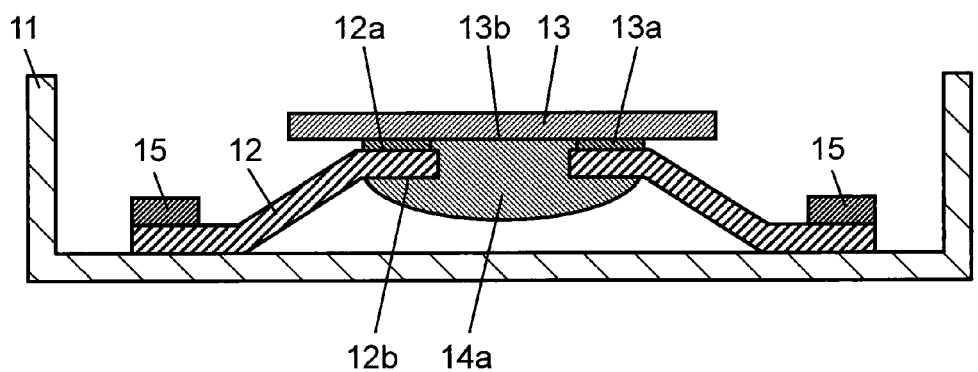
FIG. 2 is a sectional view showing another example of the piezoelectric device according to embodiment 1 of the present invention.

FIG. 2 is a sectional view showing another example of the piezoelectric device according to embodiment 1. As shown in FIG. 2, support member 14a is provided from surfaces 12b opposite to connecting surfaces 12a connected to piezoelectric oscillator 13 at the other ends of lead wires 12 to connecting surface 13b of piezoelectric oscillator 13 connected to lead wires 12 via terminals 13a. More specifically, support member 14a is formed so as to spread as far as to cover connecting surface 13b and opposite surfaces 12b at the other ends of lead wires 12 in vicinity of connecting surface 13b.

According to the structure, an area where support member 14a, lead wires 12 and piezoelectric oscillator 13 contact one another can be increased, and the electrical connection between lead wires 12 and piezoelectric oscillator 13 can thereby remain stable. As a result, the reliability of the device in electrical characteristics can be improved. Support member 14a thus useful can be formed by applying heat resistant liquid resin such as polyimide or epoxy to lead wires 12 and connecting surface 13b of piezoelectric oscillator 13 and then curing the applied resin.

Figure 3:
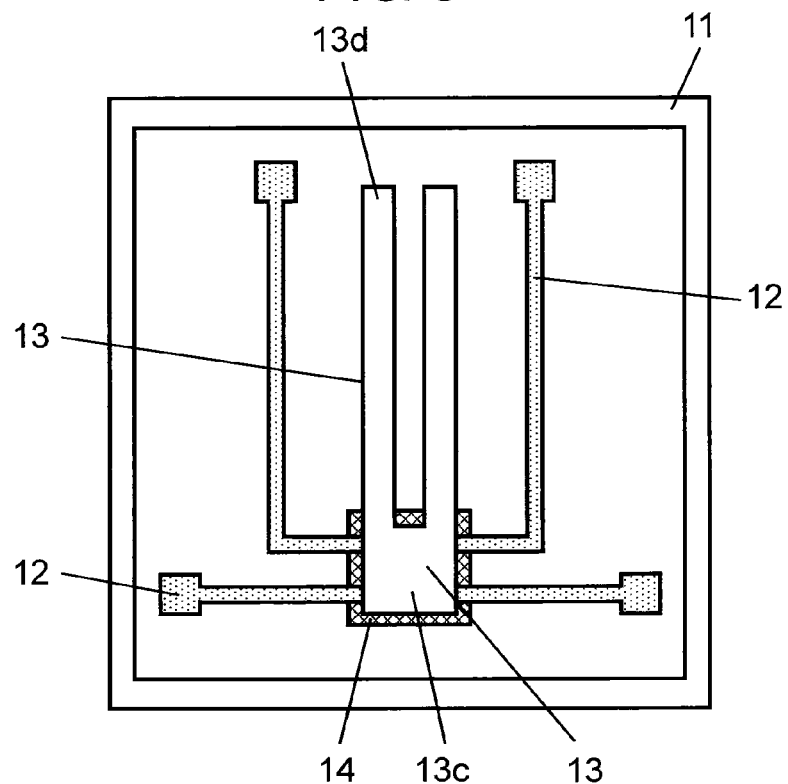
FIG. 3 is an upper view of the piezoelectric device according to embodiment 1 of the present invention.

FIG. 3 is an upper view of the piezoelectric device according to embodiment 1. It is shown in FIG. 3 that piezoelectric oscillator 13 has base portion 13c and leg portion 13d, and the other ends of lead wires 12 are connected to base portion 13c. As is known from FIG. 3, an area of support member 14 is equal to or larger than an area of the connecting surface connected to lead wires 12 in base portion 13c.

The structure thus provided can preferably disperse a stress generated in piezoelectric oscillator 13 to a larger extent using support member 14 having such a large area.

The shape of piezoelectric oscillator 13 is not limited to the shape of a tuning fork shown in FIG. 3, and any shape suitable for planned end use is preferably selected.

Figure 4:
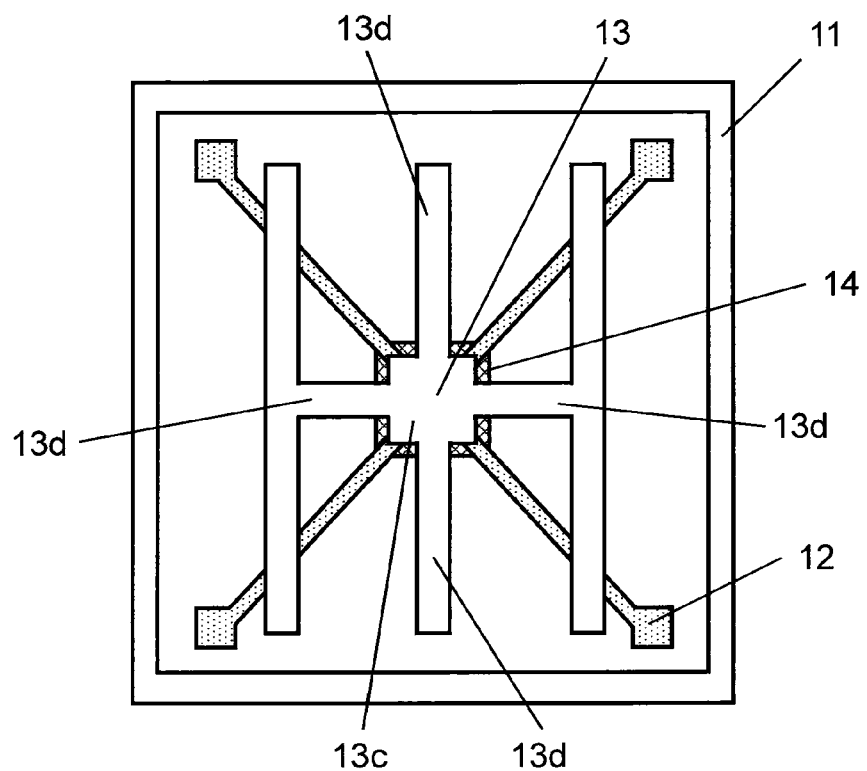
FIG. 4 is an upper view showing still another example of the piezoelectric device according to embodiment 1 of the present invention.
Figure 5:
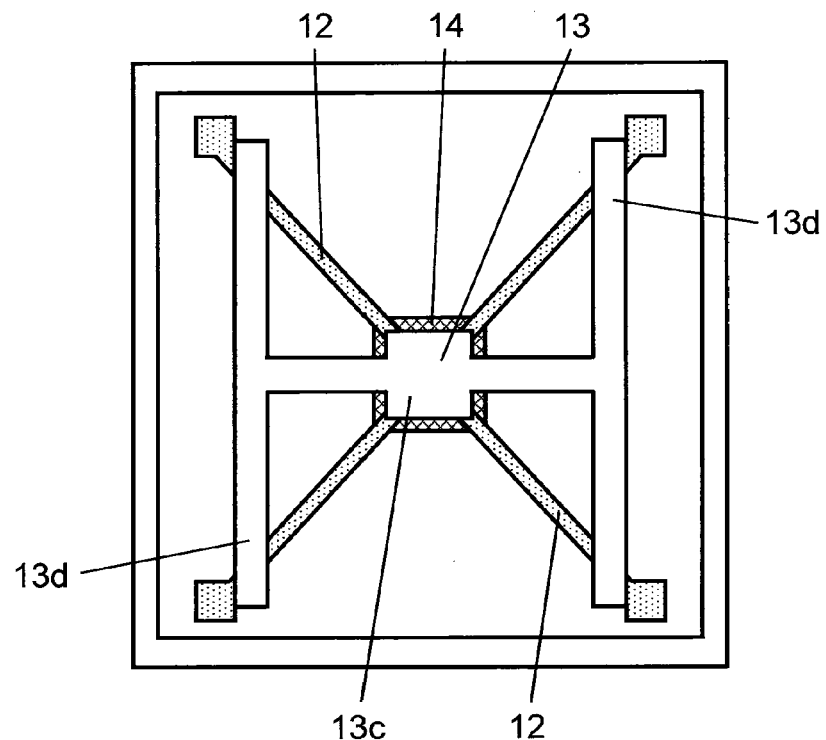
FIG. 5 is an upper view showing still another example of the piezoelectric device according to embodiment 1 of the present invention.

FIGS. 4 and 5 are upper views showing other examples of the piezoelectric device according to embodiment 1.

As shown in FIGS. 4 and 5, piezoelectric oscillator 13 may have a plurality of leg portions 13d in one base portion 13c depending on its planned end use.

Embodiment 2

Hereinafter, a piezoelectric device according to a preferred embodiment 2 of the present invention is described referring to the drawings.

Figure 6:
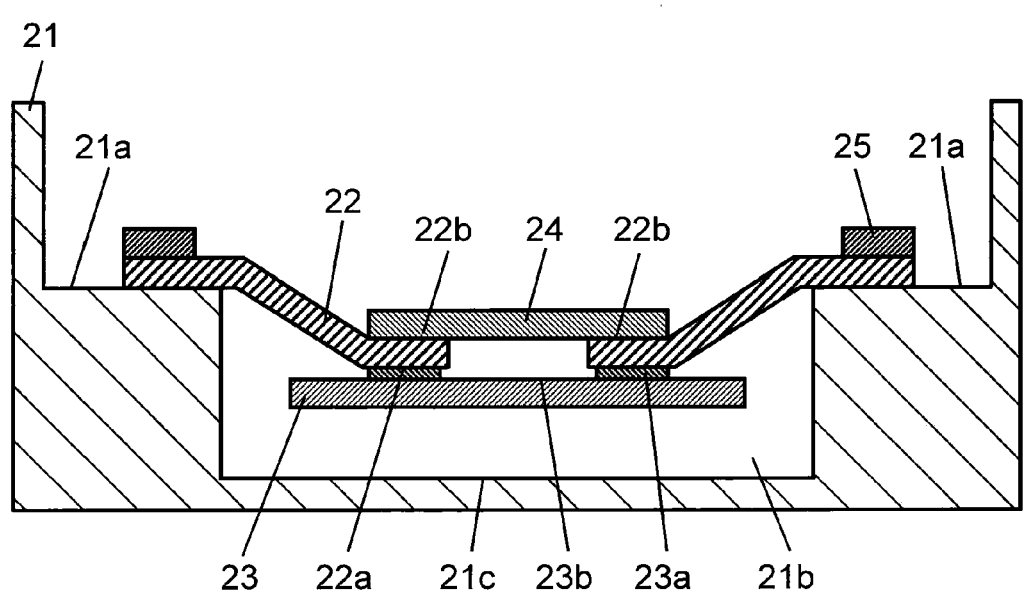
FIG. 6 is a sectional view of a piezoelectric device according to embodiment 2 of the present invention.

FIG. 6 is a sectional view of the piezoelectric device according to embodiment 2. As shown in FIG. 6, a ceramic package, for example, constitutes the piezoelectric device according to embodiment 2. The piezoelectric device includes outer housing 21 having recessed portion 21b in bottom surface 21a thereof, and lead wires 22 each having one end disposed on bottom surface 21a of outer housing 21, wherein upper surfaces of the one ends are supported by support substrate 25. The other ends of lead wires 22 extend inward of recessed portion 21b, and piezoelectric oscillator 23 is connected to the other ends of lead wires 22.

Though not shown in the drawing, on bottom surface 21a or bottom surface 21c of recessed portion 21b are formed an IC for driving the piezoelectric device according to embodiment 2 and detecting a signal from the piezoelectric device, and a circuit pattern electrically connected to the IC. The one ends of lead wires 22 are electrically connected to the circuit pattern, and the other ends of lead wires 22 are electrically connected to terminals 23a of piezoelectric oscillator 23. When these elements are thus electrically connected to one another, signals can be transmitted to and received from piezoelectric oscillator 23 and the IC, and an overall operation of the piezoelectric device is thereby enabled. In the formation of the circuit pattern, a TAB substrate is preferably used so that the piezoelectric device can be further reduced in its vertical height.

In the piezoelectric device shown in FIG. 6, support member 24 is provided on surfaces 22b opposite to connecting surfaces 22a connected to piezoelectric oscillator 23 at the other ends of lead wires 22. Materials of support member 24 are, for example, heat resistant resins such as polyimide and epoxy. More specifically, any of these resins is solidified in a plate shape and bonded to lead wires 22 and piezoelectric oscillator 23 by, for example, an adhesive.

Accordingly, support member 24, which is provided on surfaces 22b opposite to connecting surfaces 22a connected to piezoelectric oscillator 23 at the other ends of lead wires 22, disperses a stress applied to between lead wires 22 and piezoelectric oscillator 23 in support member 24. This action can reduce the likelihood that the stress is locally applied to where lead wires 22 are connected to piezoelectric oscillator 23. As a result, the reliability of the device in mechanical and electrical characteristics can be improved.

In embodiment 2, lead wires 22 are provided so that connecting surfaces 22a at the other ends thereof connected to piezoelectric oscillator 23 face bottom surface 21c in recessed portion 21b of outer housing 21. However, another possible structure in place of the one shown in FIG. 6 is that, at the other ends of lead wires 22, piezoelectric oscillator 23 is connected to the surfaces opposite to the surfaces facing bottom surface 21c in recessed portion 21b of outer housing 21, and support member 24 is provided on the surfaces facing bottom surface 21c of recessed portion 21b of outer housing 21. In other words, the alternative structure is obtained by reversing a positional relationship in vertical directions shown in FIG. 6 between piezoelectric oscillator 23 and support member 24 with the other ends of lead wires 22 interposed therebetween.

In this description, however, connecting surfaces 22a connected to piezoelectric oscillator 23 at the other ends of lead wires 22 face the inward of recessed portion 21b of outer housing 21. Such a positional relationship can preferably avoid the disadvantage that the shape of piezoelectric oscillator 23 is subject to restrictions associated with lead wires 22 as far as the volume of recessed portion 21b can accommodate the shape, thereby increasing a degree of freedom in designing the device.

Figure 7:
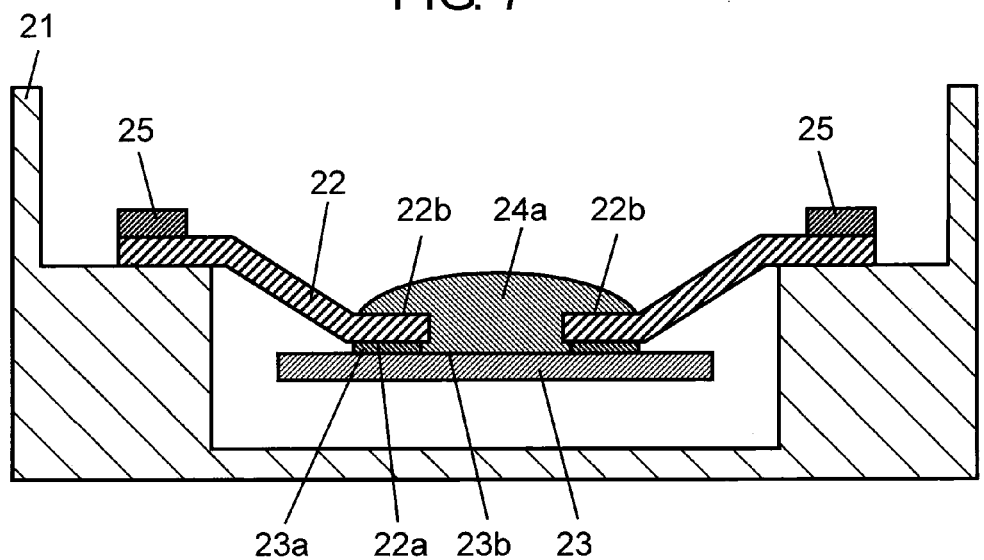
FIG. 7 is a sectional view showing another example of the piezoelectric device according to embodiment 2 of the present invention.

FIG. 7 is a sectional view showing another example of the piezoelectric device according to embodiment 2. As shown in FIG. 7, support member 24a is provided from surfaces 22b opposite to connecting surfaces 22a connected to piezoelectric oscillator 23 at the other ends of lead wires 22 to connecting surface 23b of piezoelectric oscillator 23 connected to lead wires 22 via terminals 23a. More specifically, support member 24a is formed so as to spread as far as to cover connecting surface 23b and opposite surfaces 22b at the other ends of lead wires 22 in vicinity of connecting surface 23b.

According to the structure, an area where support member 24a, lead wires 22 and piezoelectric oscillator 23 contact one another can be increased, and the electrical connection between lead wires 22 and piezoelectric oscillator 23 can thereby remain stable. As a result, the reliability of the device in electrical characteristics can be improved. Support member 24a thus useful can be formed by applying heat resistant liquid resin such as polyimide or epoxy to lead wires 22 and connecting surface 23b of piezoelectric oscillator 23 and then curing the applied resin.

In a manner similar to embodiment 1, piezoelectric oscillator 23 may have a base portion and a leg portion, wherein the other ends of lead wires 22 are connected to the base portion. In such a structure, an area of support member 24 is preferably equal to or larger than an area of connecting surface 23b connected to lead wires 22 in the base portion because a stress generated in piezoelectric oscillator 23 can be accordingly dispersed to a larger extent.

As far as piezoelectric oscillator 23 is formed so that base and leg portions are provided in a manner similar to piezoelectric oscillators 13 shown in FIGS. 3, 4 and 5, the effect described earlier can be successfully exerted.

The piezoelectric devices reduced in their vertical heights according to embodiments 1 and 2 can be loaded in, for example, an electronic device such as a digital camera and an automobile.

Figure 8:
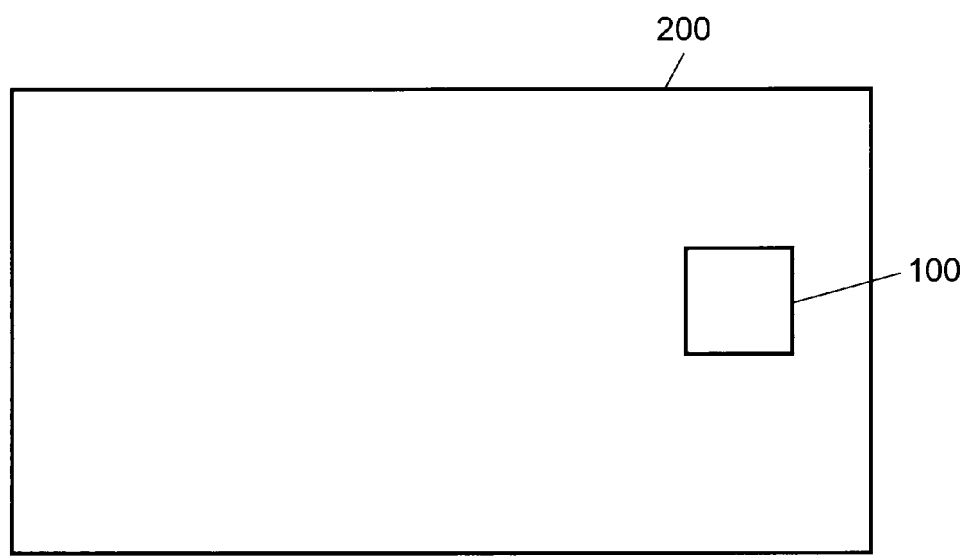
FIG. 8 is a plan view of an electronic device equipped with the piezoelectric devices according to embodiments 1 and 2 of the present invention.
Figure 9:
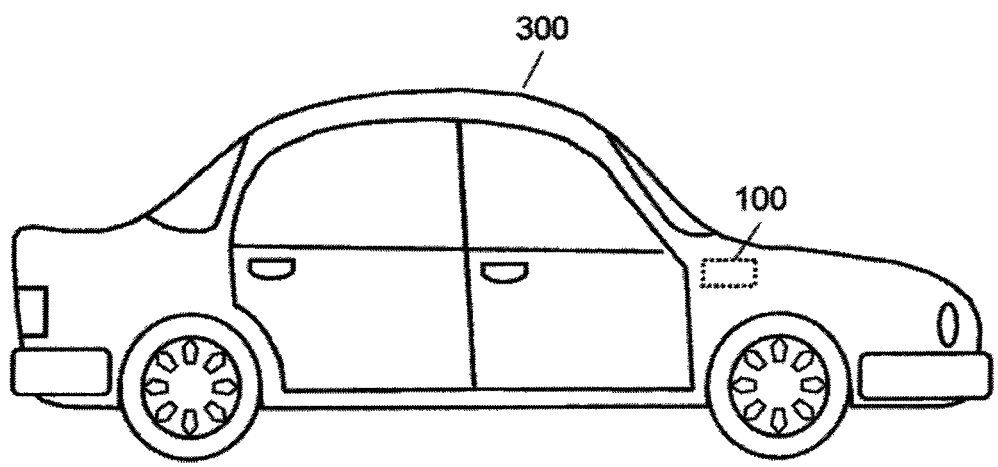
FIG. 9 is a side view of an automobile equipped with the piezoelectric devices according to embodiments 1 and 2 of the present invention.
Figure 10:
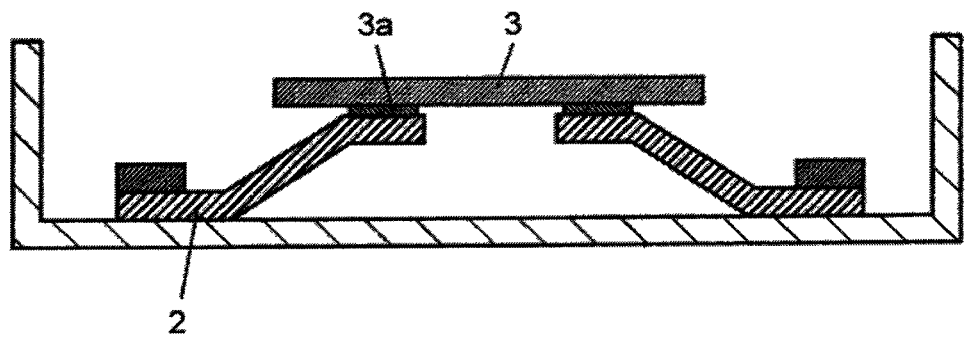
FIG. 10 is a sectional view of a conventional piezoelectric device.

FIG. 8 is a plan view of an electronic device loaded with either of the piezoelectric devices according to embodiments 1 and 2. FIG. 9 is a side view of an automobile loaded with either of the piezoelectric devices according to embodiments 1 and 2.

Electronic device 200 shown in FIG. 8 is equipped with, for example, piezoelectric device 100 shown in FIG. 1. Piezoelectric device 100 includes lead wires 12 each having one end electrically connected to a circuit pattern (not shown) and piezoelectric oscillator 13 having terminals 13a electrically connected to the other ends of lead wires 12 as shown in FIG. 1. In piezoelectric device 100, piezoelectric oscillator 13 is retained in suspension by the other ends of lead wires 12, and support member 14 is provided on surfaces 12b opposite to connecting surfaces 12a connected to piezoelectric oscillator 13 at the other ends of lead wires 12.

In piezoelectric device 100, support member 14a may be provided from opposite surfaces 12b adjacent to connecting surfaces 12a connected to piezoelectric oscillator 13 at the other ends of lead wires 12 to the connecting surface of piezoelectric oscillator 13 connected to lead wires 12 as shown in FIG. 2.

When piezoelectric device 100 thus highly reliable in electrical characteristics is mounted in electronic device 200 such as a digital camera, an electronic device having a more accurate sensing feature can be obtained.

Automobile 300 shown in FIG. 9 is loaded with piezoelectric device 100 highly reliable in electrical characteristics shown in FIG. 1 or 2. Accordingly, automobile 300 having a more accurate sensing feature can be obtained.

More specifically, the piezoelectric devices according to embodiments 1 and 2 are mounted as, for example, a mobile telephone navigation sensor, an in-vehicle navigation sensor, a sensor used in a vehicle control system, or a blurred image correction sensor for an imaging element. As a result, electronic devices and automobiles, which are less likely to undergo any electrical failures and capable of performing a sensing operation more reliably and accurately, can be obtained.

INDUSTRIAL APPLICABILITY

The piezoelectric device according to the present invention is advantageous in its high reliability in electrical characteristics, ensuring a stable and sound operation in automobiles and various electronic devices.

The invention claimed is:

1. A piezoelectric device comprising:
    a lead wire having one end electrically connected to a circuit pattern; and
    a piezoelectric oscillator having a terminal electrically connected to another end of the lead wire, wherein
    the other end of the lead wire includes a connecting surface and an opposite surface,
    the connecting surface is connected to the piezoelectric oscillator,
    the opposite surface is opposite to the connecting surface,
    the piezoelectric oscillator is retained in suspension by the other end of the lead wire, and
    a support member is provided on the opposite surface of the other end of the lead wire.

2. The piezoelectric device as claimed in claim 1, wherein the support member is provided from the opposite surface adjacent to the connecting surface connected to the piezoelectric oscillator at the other end of the lead wire to a connecting surface of the piezoelectric oscillator connected to the lead wire.

3. The piezoelectric device as claimed in claim 2, wherein the piezoelectric oscillator includes a base portion and a leg portion, and the other end of the lead wire is connected to the base portion, and an area of the support member is equal to or larger than an area of the connecting surface connected to the lead wire in the base portion.

4. The piezoelectric device as claimed in claim 2, wherein the support member is made of a resin adhesive.

5. The piezoelectric device as claimed in claim 1, wherein the connecting surface of the lead wire connected to the piezoelectric oscillator at the other end thereof is opposite to the surface of the lead wire facing a surface of an outer housing where the one end of the lead wire is disposed.

6. The piezoelectric device as claimed in claim 1, further comprising:
   an outer housing having a recessed portion in a bottom surface thereof, wherein
   the one end of the lead wire is disposed on the bottom surface of the outer housing, and
   the piezoelectric oscillator is provided inward of the recessed portion.

7. The piezoelectric device as claimed in claim 6, wherein
   the support member is provided from the surface opposite to the connecting surface connected to the piezoelectric oscillator at the other end of the lead wire to a connecting surface of the piezoelectric oscillator connected to the lead wire.

8. The piezoelectric device as claimed in claim 7, wherein the piezoelectric oscillator includes a base portion and a leg portion, and the other end of the lead wire is connected to the base portion, and an area of the support member is equal to or larger than an area of the connecting surface connected to the lead wire in the base portion.

9. The piezoelectric device as claimed in claim 7, wherein the support member is made of a resin adhesive.

10. The piezoelectric device as claimed in claim 6, wherein
    the connecting surface connected to the piezoelectric oscillator at the other end of the lead wire faces the inward of the recessed portion.

11. An electronic device equipped with a piezoelectric device comprising:
    a lead wire having one end electrically connected to a circuit pattern; and
    a piezoelectric oscillator having a terminal electrically connected to another end of the lead wire, wherein
    the other end of the lead wire includes a connecting surface and an opposite surface,
    the connecting surface is connected to the piezoelectric oscillator,
    the opposite surface is opposite to the connecting surface,
    the piezoelectric oscillator is retained in suspension by the other end of the lead wire, and
    a support member is provided on the opposite surface of the other end of the lead wire.

12. The electronic device as claimed in claim 11, wherein
    the support member is provided from the opposite surface adjacent to the connecting surface connected to the piezoelectric oscillator at the other end of the lead wire to a connecting surface of the piezoelectric oscillator connected to the lead wire.

13. The electronic device as claimed in claim 11, wherein
    an outer housing having a recessed portion in a bottom surface thereof is further provided, and
    the one end of the lead wire is disposed on the bottom surface of the outer housing, and
    the piezoelectric oscillator is provided inward of the recessed portion.

14. An automobile equipped with a piezoelectric device comprising:
    a lead wire having one end electrically connected to a circuit pattern; and
    a piezoelectric oscillator having a terminal electrically connected to another end of the lead wire, wherein
    the other end of the lead wire includes a connecting surface and an opposite surface,
    the connecting surface is connected to the piezoelectric oscillator,
    the opposite surface is opposite to the connecting surface,
    the piezoelectric oscillator is retained in suspension by the other end of the lead wire, and
    a support member is provided on the opposite surface of the other end of the lead wire.

15. The automobile as claimed in claim 14, wherein
    the support member is provided from the opposite surface adjacent to the connecting surface connected to the piezoelectric oscillator at the other end of the lead wire to a connecting surface of the piezoelectric oscillator connected to the lead wire.

16. The automobile as claimed in claim 14, wherein
    an outer housing having a recessed portion in a bottom surface thereof is further provided, and
    the one end of the lead wire is disposed on the bottom surface of the outer housing, and the piezoelectric oscillator is provided inward of the recessed portion.

* * * * *